United States Patent [19]

Kitagawa et al.

[11] 4,144,590
[45] Mar. 13, 1979

[54] INTERMEDIATE OUTPUT BUFFER CIRCUIT FOR SEMICONDUCTOR MEMORY DEVICE

[75] Inventors: Norihisa Kitagawa; Lionel S. White, Jr., both of Houston, Tex.

[73] Assignee: Texas Instruments Incorporated, Dallas, Tex.

[21] Appl. No.: 756,921

[22] Filed: Dec. 29, 1976

[51] Int. Cl.² .............................................. G11C 7/06
[52] U.S. Cl. ............................ 365/205; 307/DIG. 3; 307/DIG. 4; 365/203
[58] Field of Search ..... 340/173 CA, 173 R, 173 FF; 307/238, 279, DIG. 3, DIG. 4; 365/205, 203, 154, 156, 190

[56] References Cited

U.S. PATENT DOCUMENTS

| | | | |
|---|---|---|---|
| 3,678,473 | 7/1972 | Wahlstrom | 340/173 CA |
| 3,838,295 | 9/1974 | Lindell | 340/173 CA |
| 3,983,412 | 9/1976 | Roberts et al. | 340/173 FF |
| 3,992,704 | 11/1976 | Kantz | 340/173 CA |
| 4,031,522 | 6/1977 | Reed et al. | 307/DIG. 3 |
| 4,039,861 | 8/1977 | Heller et al. | 340/173 CA |
| 4,077,031 | 2/1978 | Kitagawa et al. | 365/205 |

OTHER PUBLICATIONS

Chu et al., "Low-Power, High-Speed Sense Latch", *IBM Tech. Disc. Bull.*, vol. 17, No. 9, pp. 2582-2583, Feb. 1975.

Bishop et al., "High-Sensitivity High-Speed FET Sense Latch", *IBM Tech. Disc. Bull.*, vol. 18, No. 4, pp. 1021-1022, Sept. 1975.

Arzubi, "Sense Amplifier for Capacitive Storage", *IBM Tech. Disc. Bull.*, vol. 19, No. 2, pp. 407-408, Jul. 1976.

*Primary Examiner*—Bernard Konick
*Assistant Examiner*—Donald E. McElheny, Jr.
*Attorney, Agent, or Firm*—John G. Graham

[57] ABSTRACT

A random access memory device of the MOS integrated circuit type employs an array of rows and columns of one-transistor storage cells with sense amplifier circuits at the center of each column and an intermediate output buffer having inputs connected to both sides of the column lines. The intermediate output buffer is a bistable circuit wherein the load transistors have clock voltages applied to their gates after an initial sensing period, so the initial sensing of data on the column lines is done without loads. After this initial period, the load transistors are turned on by booting capacitors. Then, transistors shunting the gates of the load devices to the sense nodes function to turn off the load device on the zero logic level side. The gates of these shunting transistors are each controlled by the voltages on the sense node on the opposite side of the bistable circuit.

13 Claims, 16 Drawing Figures

INTERMEDIATE OUTPUT BUFFER CIRCUIT FOR SEMICONDUCTOR MEMORY DEVICE

RELATED CASES

This application in part discloses subject matter disclosed in our prior copending applications Ser. No. 691,734, filed June 1, 1976 now abandoned and refiled June 30, 1978, as Ser. No. 920,756, and Ser. No. 716,843, filed Aug. 23, 1976 now U.S. Pat. No. 4,077,031.

BACKGROUND OF THE INVENTION

This invention relates to semiconductor memory devices and more particularly to an improved intermediate output buffer for an MOS memory device.

The most widely used semiconductor memory device at present is the N-channel MOS dynamic RAM of the type disclosed in U.S. Pat. No. 3,940,747, issued Feb. 24, 1976 to C-K Kuo and N. Kitagawa, assigned to Texas Instruments, where a "4K" or 4096 bit random access memory is described. This device is also shown at pp. 116-121 in the Sept. 13, 1973 issue of Electronics. Higher density dynamic RAM's are shown in Electronics, Feb. 19, 1976, pp. 116-121, and May 13, 1976, pp. 81-86, where "16K" or 16384 bit memory devices are described. Our pending U.S. patent application Ser. No. 691,734, filed June 1, 1976, assigned to Texas Instruments, likewise shows a 16K RAM.

In these prior dynamic RAM's the data output is usually taken from one side of a column line, and data input is to the same side, even though the addressed cell is on the opposite side. In high density devices such as the 16K, the capacitance of the column lines or sense lines is high, resulting in delay due to the time required for the lines to charge or discharge to full logic levels. It is therefore preferable to sense the logic levels on the column lines, on each side of the sense amplifiers, and generate high level outputs, by means of intermediate output buffers.

It is therefore the principal object of the invention to provide an improved semiconductor memory device which operates at higher speed or shorter access time. Another object is to provide an intermediate output buffer which speeds up the transfer of data from a cell array to the output terminal of a memory device.

SUMMARY OF THE INVENTION

In accordance with an embodiment of the invention, an MOS RAM using one-transistor cells employs a bistable sense amplifier in the center of each column line. An intermediate output buffer has inputs connected via the column decoder to each side of the sense amplifiers. The intermediate output buffer has a pair of cross-coupled driver transistors connected as a bistable circuit. Precharge/load transistors for sense nodes at the drains of the pair of driver transistors are clocked on only during a part of the operating cycle by a control arrangement. The driver transistors may be singly grounded by a single device or may be connected to ground through two different paths provided by two transistors which are clocked on at different times in accordance with the U.S. Pat. No. 4,050,061 by N. Kitagawa and J. C. McAlexander, assigned to Texas Instruments. The sense nodes are coupled to the column lines at the beginning of an initial sensing period; one side of a column line will be going low and the other staying high. During this initial sensing period, the current through the driver transistors is kept low, then allowed to be higher during a later time so that an output of full logic level is produced. The precharge/load transistors are clocked on after the initial sensing period, i.e., during said later time, by booting capacitors. The gates of the precharge/load transistors are connected to the sources of the driver transistors by shunting transistors, each of which has its gate directly connected to the sense node on the opposite side of the bistable circuit. The shunt transistors function to turn off the precharge/load transistor on the zero-going side of the bistable circuit, and thus save power and allow faster operation.

BRIEF DESCRIPTION OF THE DRAWINGS

The novel features believed characteristic of the invention are set forth in the appended claims; the invention itself, however, as well as other features and advantages thereof, will best be understood by reference to the following detailed description of illustrative embodiments, when read in conjunction with the accompanying drawings, wherein:

DETAILED DESCRIPTION OF SPECIFIC EMBODIMENT

The Memory System

Figure 1:
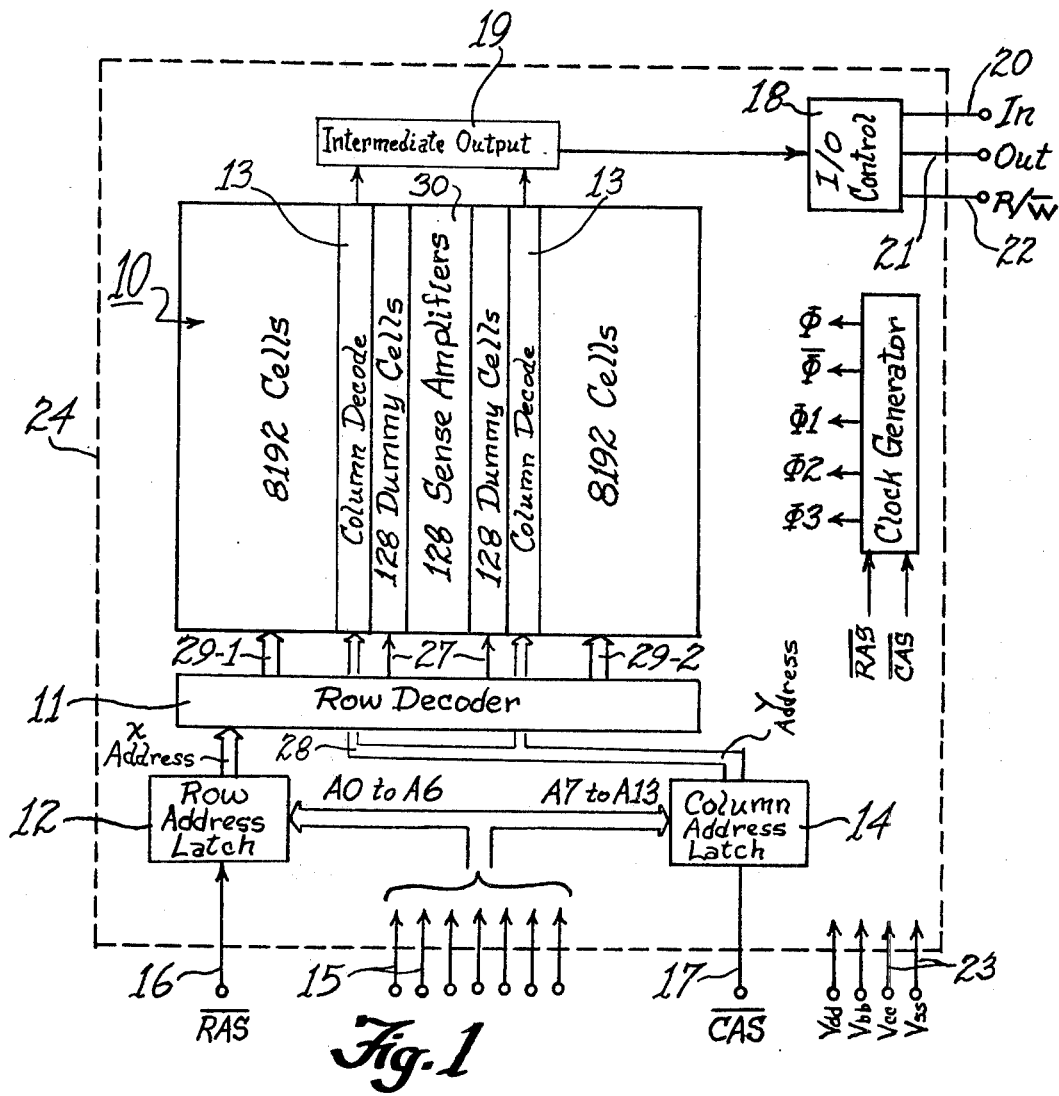
FIG. 1 is a block diagram of a semiconductor memory device which may utilize the circuit of the invention.
Figure 4:
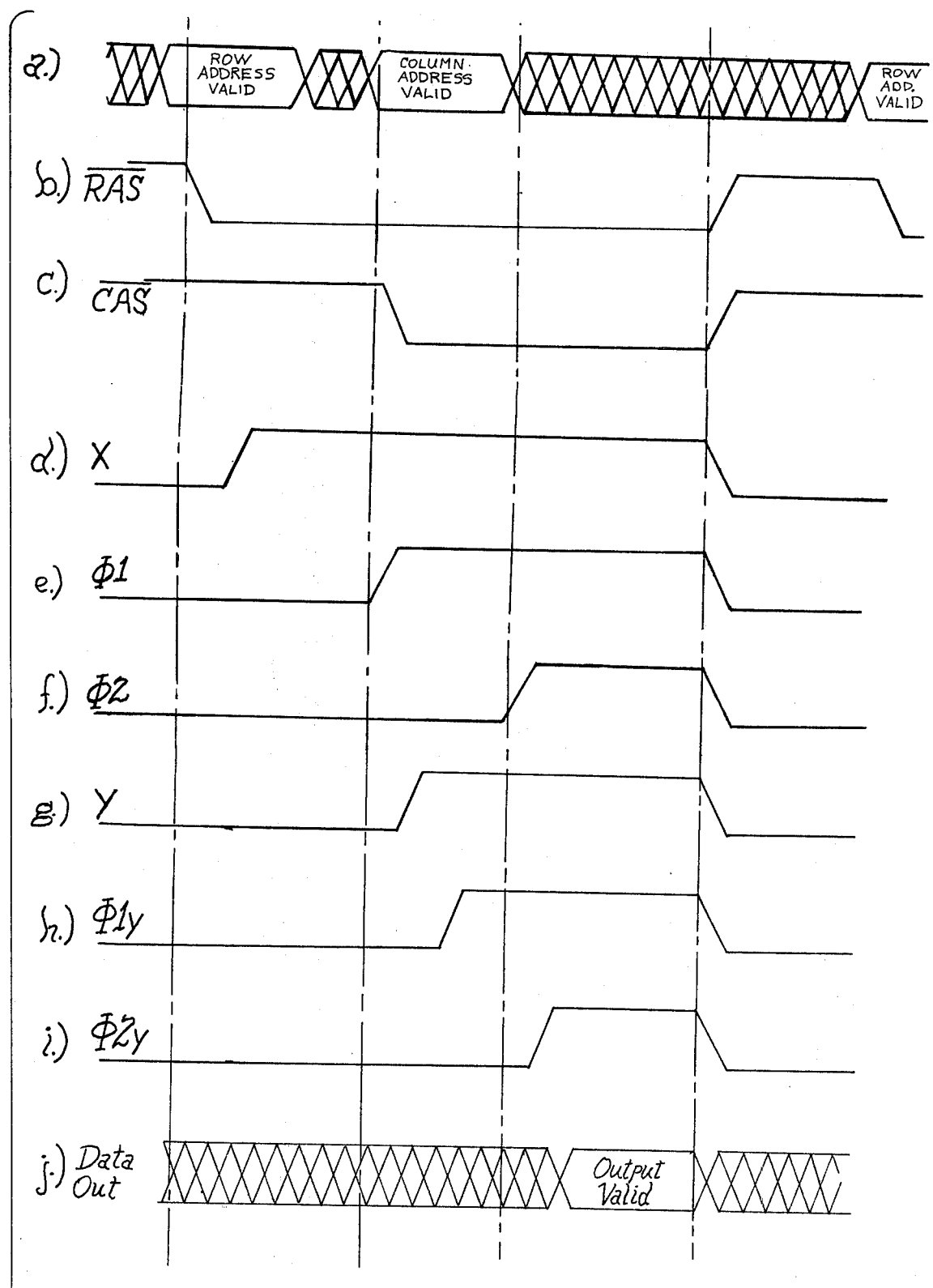
FIGS. 4a-4j are graphic representations of voltages appearing at various points in the system of the invention, plotted as a function of time.

Referring to FIG. 1, an MOS memory device which may use the invention is illustrated. While this device may be of various sizes, the invention was intended for use in a very high density memory containing 16,384 cells on one silicon chip of about one-twentieth square inch, made by an N-channel silicon-gate self-aligned MOS process which is described in U.S. Pat. Application Ser. No. 648,594, filed Jan. 12, 1976 by C-K Kuo for MOS Memory Cell Using Double Level Polysilicon, assigned to Texas Instruments. The device consists of an array 10 of 16,384 memory cells which is generally divided into 128 rows and 128 columns; each cell is a so-called one-transistor cell of the type shown in said application Ser. No. 648,594. A row decoder 11 selects one of the 128 row lines as determined by a row or X address contained in a seven-bit row address buffer or latch 12, and a column decoder 13 selects one of the 128 column lines as determined by a column or Y address contained in a seven-bit column address buffer 14. These addresses are applied to the chip by seven address lines 15, on a time-share basis (as seen in FIG. 4a).

Figure 2:
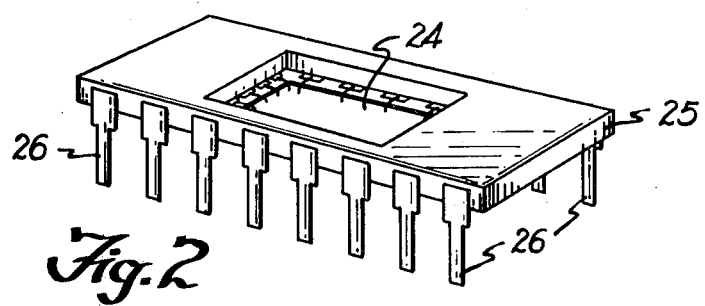
FIG. 2 is a pictorial view of the device of FIG. 1 in a package.

An RAS or row address strobe input 16 (seen in FIG. 4b) when at zero volts enables the row address buffer 12 to accept a row address, which includes address bits A0 to A6. In like manner a CAS or column address strobe input 17 (seen in FIG. 4c) when at zero volts enables the column address buffer to accept a column address (bits A7 to A13) from the lines 15. The row and column addresses must be valid on the pins 14 during the time periods shown in FIG. 4a. Fourteen address bits are needed to uniquely define one bit of 16,384 cells ($2^{14}$ = 16,384). Input/output control circuitry 18 is connected to the array 10 via column decode 13 and an intermediate output buffer 19 according to the invention. This arrangement functions to apply data to the column lines from a data input pin 20, or to detect data on the column lines and apply it to a data output pin 21, under conrol of a read/write R/W input 22 as well as under control of various internally generated clock and logic voltages. The device requires several supply or input voltages on pins 23; these may include Vbb, Vcc and Vdd supply voltages as well as ground or Vss. Of course, some circuits are designed to operate on one or two supply voltages rather than three. Typically, Vdd = 12v., Vbb = −5v. and Vcc = +5v. As seen in FIG. 2, the device of FIG. 1 is in the form of a silicon chip 24 mounted in a package 25 which has sixteen pins 26 corresponding to the sixteen input and output lines mentioned above. Thin gold wires connect bonding pads on the silicon chip 24 to internal terminals for the pins 26. A lid, not shown, would seal the device. The package 24 is about ¾ inch in length and 0.3 inch in width so as a large number of these packages can be mounted on a standard sized circuit board. For example, a minicomputer may have an entire 32K or 64K word (16 bits/word) memory on one small circuit board.

The row decoder 11, of conventional design, functions to select one out of the sixty-four row lines 29-1 on the left side or one of the sixty-four row lines 29-2 on the right side. A row line is a metal line which extends along most of the width of the chip and drives the gates of 128 MOS transistors in the 128 memory cells associated with this row. The seven address bits A0 to A6 in row decoder 11 select one row line 29 out of 128 to go high, the remaining 127 remain low. The row addresss (referred to as X in FIGS. 4d and 5) exists on the selected lines 29 during the RAS time of FIG. 4b. Address bit A6 selects either left or right side, i.e., permits activation of either lines 29-1 or lines 29-2. Then the six bits of A0 to A5 will select one of the sixty-four lines in the selected half. A6 will also determine activation of dummy cells in the unselected side via dummy cell address lines 27, during RAS, as is conventional. The column address latch provides a seven-bit (and complements) address on lines 28 which selects one of the 128 columns by the column decode circuitry 13, of conventional design. A set of 128 sense amplifiers 30 in the center of each column line detect the low level signal created on the selected column line when a cell is addressed and convert this low signal to a full logic level.

The Cell Array and Sense Amplifiers

Figure 3:
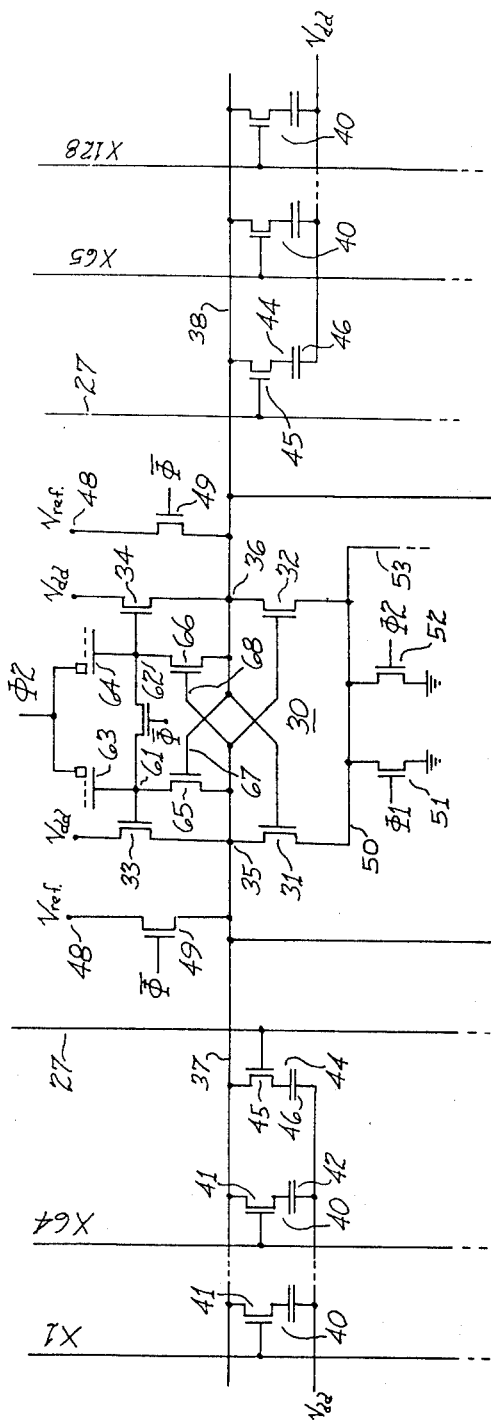
FIG. 3 is an electrical schematic diagram of an array of memory cells for the system of FIG. 1, along with the intermediate output buffers of the invention.
Figure 3:
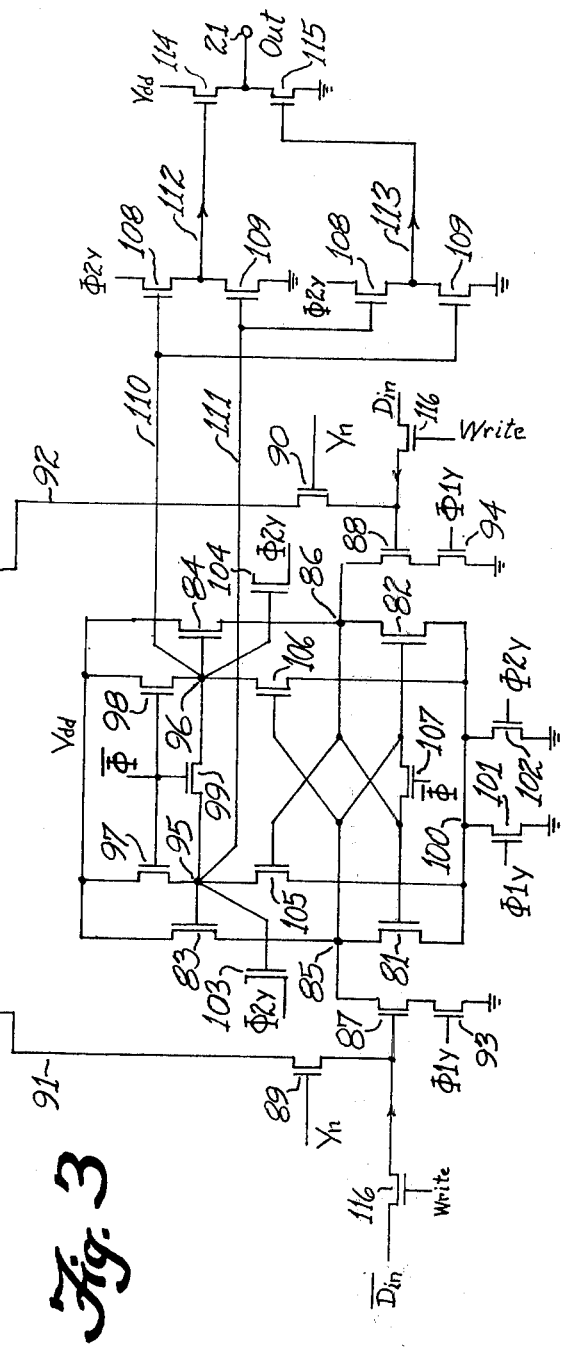

Referring to FIG. 3, a sense amplifier 30, illustrated in a small part of the array 10, basically consists of a flip-flop or bistable circuit having two cross-coupled driver transistors 31 and 32 along with associated load transistors 33 and 34. A pair of nodes 35 and 36 are connected to the respective halves 37 and 38 of the column line. These nodes 35 and 36 are connected to the gates of the opposite transistors 31 and 32 to provide a cross-couple arrangement.

The line 37, half of a column line, has sixty-four cells 40 connected to it, and so does the line 38 which is the other half. Each cell consists of a transistor 41 and a capacitor 42; the gate of each transistor 41 is controlled by a row line 29-1 or 29-2 (the row line is also referred to as a word line and an X line and one of these X lines will receive an X address of FIG. 4d), and each row line is connected to one-hundred twenty-eight gates for like transistors 41. Each sense amplifier has two dummy cells 44, one on each side, connected to the column lines 37 and 38. The dummy cells are like the storage cells 40, and each includes a transistor 45 and a capacitor 46. Lines 27 function to turn on the transistor 45 in the row of dummy cells on the opposite side of the sense amplifier from the selected cell 40 as defined by bit A6 of the row address, at the same time the selected storage cell 40 is addressed. Each column line 37 or 38 is connected to a reference voltage line 48 through a transistor 49, with the gates of these transistors being driven by $\overline{\Phi}$, a signal of approximately the same timing as RAS; this functions to charge the lines 37 and 38 equally from a reference voltage level selected to be Vdd or slightly below Vdd. For example, if Vdd is +12v. and Vt is about 1 volt, Vref may be about ten or eleven volts. To simplify the layout, however, Vdd may be used. The load transistors 33 and 34 are connected to Vdd and are controlled by an arrangement which is the subject of our application Ser. No. 691,734. The flip-flop circuit including the transistors 31 and 32 begins to function before the transistors 33 and 34 are rendered conductive when a node 50 connected to the drains of the transistors is coupled to ground.

As in the U.S. Pat. No. 4,050,061 of Kitagawa and McAlexander, the node 50 is grounded through separate paths including in this case two transistors 51 and 52 which are controlled by clocks $\Phi 1$ and $\Phi 2$ of FIG. 4e and 4f. The transistors 51 and 52 are of different sizes so the amount of current drawn by these transistors from the node 50 to Vss or ground is different. Thus, the voltage on the node 50 will change depending upon which of the transistors 51 and 52 is on. Transistor 51 is the smallest and transistor 52 is about twice its size, measured in device ratio or width to length of the channel. All 128 of the sense amplifiers 30 in the array 10 share the same pair of transistors 51 and 52; a line 53A connects together the nodes 50 of all these sense amplifiers.

When a clock $\Phi 1$ of FIG. 4e goes positive, a sense operation is initiated, and the flip-flop will tend to go toward a stable condition where either transistor 31 is conductive and transistor 32 is cut off, or vice versa. The direction of switching will depend upon the voltage difference between lines 37 and 38 which depends upon whether a one or zero was stored in the selected cell 40. Since one of the lines 37 or 38 will be at a slightly higher voltage than the other, one of the transistors 31 or 32 will have a slightly higher voltage on its gate than the other, and thus when $\Phi 1$ goes positive one transistor will tend to conduct slightly more current than the other.

In the circuit of FIG. 3 the precharge voltage on the one of the digit line halves 37 or 38 which is to stay at "1" logic level tends to stay high during an initial sensing period, i.e., when $\Phi 1$ is high but before $\Phi 2$ comes high. The sense amplifier 30 provides a minimum charging time for the digit lines 37 or 38 to refresh a "1" level because the node of the sense amplifier which is to stay at the "1" level does not discharge to a low voltage during the initial sense operation.

Figure 5:
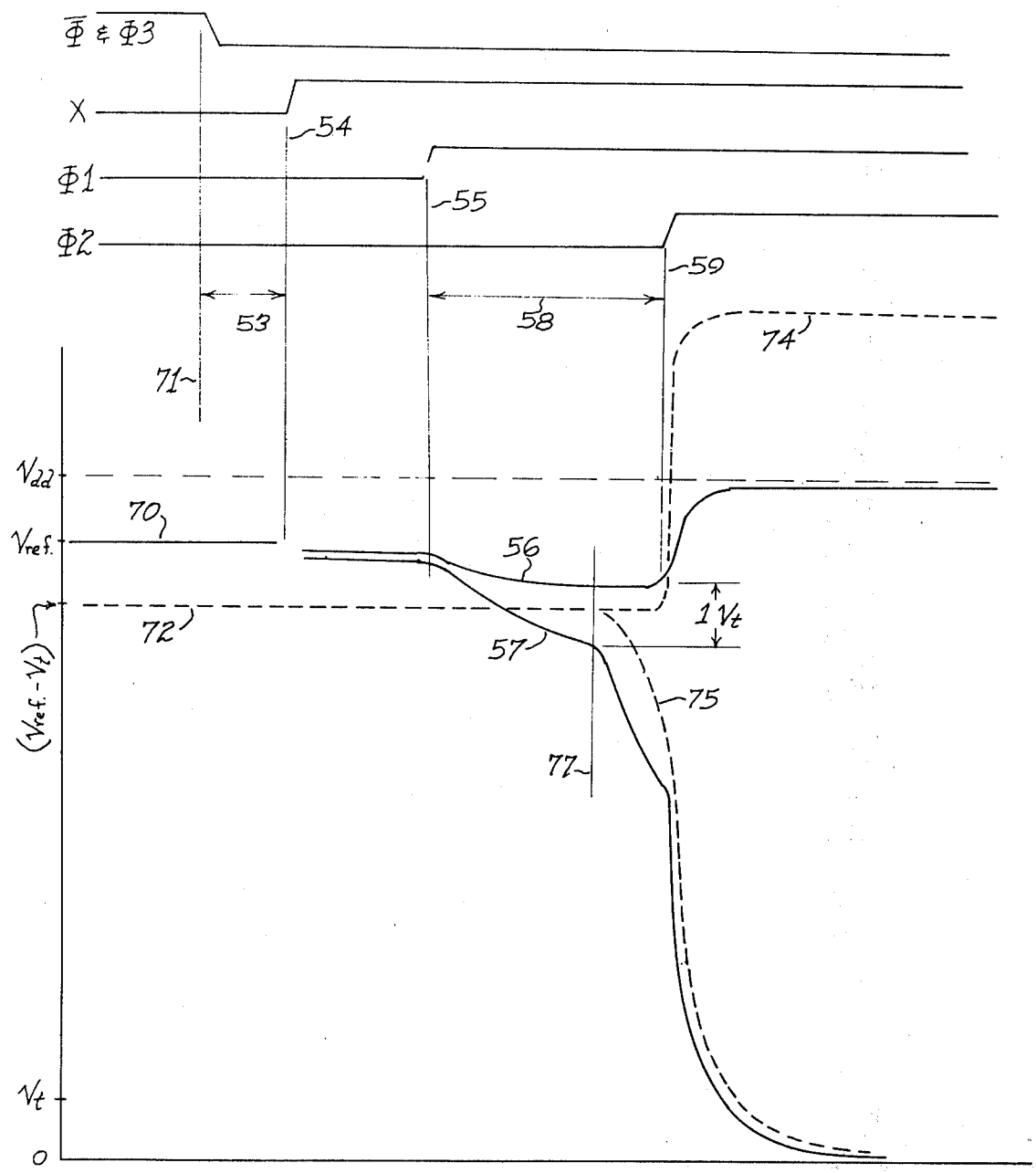
FIG. 5 is a detailed graphic representation of voltage vs. time for certain nodes in the circuit of FIG. 3.

Referring to FIG. 5, the voltage on the digit lines 37 and 38 is shown in enlarged view as a function of time as the clock Φ1 comes on. During the time 53, before the address actuates one of the row lines 29-1 or 29-2 and before Φ1 goes high, the voltage on the digit lines 37 and 38 is equalized at Vref or near Vdd as defined by charging from the line 48. At a time 54, one of the lines 29-1 or 29-2 goes high, and the voltages on the lines 37 and 38 separate very slightly, perhaps 50 to 100 multivolt due to one of the storage capacitors 42 being connected to one side and a dummy cell capacitor 46 (smaller than 42) being connected to the other. At time 55, Φ1 goes high and one of the lines 37 or 38 begins to discharge toward a "0" level during an interval 58 while the other discharges only slightly, not over about 0.3 volt, as seen by lines 56 and 57. In the time interval 58 prior to the time 59 when Φ2 comes on, if a "1" was stored, the transistor 31 or 32 opposite the selected cell will conduct more than the one opposite the dummy cell. If a "0" is stored, the reverse is true.

The sense amplifier 30 of FIG. 3 includes a particular arrangement for controlling conductance of the load transistors 33 and 34. Nodes 61 and 62 at the gates of the load transistors 33 and 34 are connected to the clock Φ2 source via gated capacitors 63 and 64, and are also connected to the digit lines 37 and 38 via transistors 65 and 66. These transistors 65 and 66 have their gates connected to the opposing digit lines 37 and 38, via lines 67 and 68. The booting capacitors 63 and 64 produce a high drive voltage on the gates of the load transistors 33 and 34, permitting rapid charging of the digit line which is to be restored to the "1" level, as seen by the line 56 of FIG. 5. This speeds the restoration of the "1" level voltage in the selected storage cell 40. The transistors 65 and 66 provide for discharge of the driving voltage on one of the nodes 61 or 62 at the gate of the load transistor on the zero-going side of the sense amplifier, reducing power consumption and improving operating speed.

During $\overline{\Phi}$ high the lines 37 and 38 (nodes 35 and 36) are precharged to a level 70 while X, φ1 and φ2 are zero; the nodes 61 and 62 will be charged through transistors 65 and 66 to a level 72 during that period. The level 72 differs from the level 70 by the drop across the transistors 65 or 66. The nodes 61 and 62 are equalized during $\overline{\phi}$ by a transistor 73 connected between these nodes. When $\overline{\phi}$ goes to zero at time 71, the digit lines 37 and 38 are isolated from Vref, and at the same time the nodes 61 and 62 are isolated from one another as the transistor 73 cuts off. The transistors 65 and 66, driven by the opposing digit lines, will now provide discharge paths so that (a) the charge on the node 61 or 62 and on the booting capacitor 63 or 64 that is connected to the one-going side of the sense amplifier is not discharged during sensing and (b) the charge on the other node and booting capacitor connected to the zero-going side is discharged as the voltage on the digit line falls during sensing. As the voltage differential between the digit lines 37 and 38 is established by charge sharing of the dummy cell capacitance 46 and the storage cell capacitance 42, and as the selected X line 29-1 or 29-2 goes high and the dummy cell select line 27 goes high, the operation is as mentioned above with reference to the interval 58 of FIG. 5. As Φ1 goes high at time 55, amplification of the voltage difference begins. The initial level 72 of the voltage on the "one-going" one of the nodes 61 and 62 is maintained until time 59 in FIG. 5 while the other may begin to drop toward zero as seen by the line 75, because during interval 58 the voltage on the nodes 35 and 36 changes as seen by lines 56 and 57; so long as the separation is less than Vt transistors 65 and 66 cannot turn on, but when the separation reaches Vt at time 77, one turns on. Then φ2 goes high at time 59, which will tend to boot the voltage (line 72) on the gates of the load devices 33 and 34 via capacitors 63 and 64, and also will turn on the transistor 52 and speed the discharge of the zero-going side as seen by the line 57 of FIG. 5. At a time 77 when the digit line voltage on the zero-going side drops one Vt below the instantaneous level on the one-going side, the sensing operation is complete and one of the transistors 65 or 66 will turn on and begin discharging the voltage on the booting capacitor 63 or 64 for this side, thus turning off the corresponding load device 33 or 34. At this point, the voltages on nodes 61 and 62 separate as lines 74 and 75 in FIG. 5.

The Intermediate Output Buffer

In FIG. 3, an intermediate output buffer circuit 19 according to the invention is illustrated, comprising a pair of driver transistors 81 and 82 which are connected in series with a pair of precharge and load transistors 83 and 84. Sense nodes 85 and 86 between the driver and precharge/load transistors are coupled to the bit line or column line halves 37 and 38 for the selected column via input transistors 87 and 88, Y select transistors 89 and 90, and lines 91 and 92. The input transistors 87 and 88 are grounded through transistors 93 and 94 which are gated on Φ1. The gates of the precharge/load transistors 83 and 84 are connected to nodes 95 and 96, which are precharged from +Vdd via transistors 97 and 98 and equalized by a transistor 99, all gated on $\overline{\Phi}$. The nodes 95 and 96 are booted to a higher level during the operation of the circuit by a pair of gated capacitors 103 and 104 which correspond to the capacitors 63 and 64 in the sense amplifier 30. The lower part of these capacitors is connected to Φ2Y. The nodes 95 and 96 are connected by shunting transistors 105 and 106 (corresponding to the transistors 65 and 66 in the sense amplifier) to a node 100 in a grounding arrangement. The node 100 connects the sources of the drive transistors 81 and 82 to ground through a pair of transistors 101 and 102 which are of different sizes and function like the transistors 51 and 52 discussed above with reference to the sense amplifier. Thus, the nodes 95 and 96 are grounded via transistors 105 and 106, using the node 100 in the same way the driver transistors are grounded. A transistor 107 connects the gates of the transistors 81 and 82, and thus the nodes 85 and 86, together on $\overline{\Phi}$.

In operation of the intermediate output buffer 19, the initial condition is established when $\overline{RAS}$ is high and $\overline{\Phi}$ is high; this turns on the transistors 97, 98, 99 and 107 and charges the nodes 95 and 96 to (Vdd-Vt) and equalizes these nodes. The precharge/load transistors 83 and 84 are turned on by the precharge on the gates so the nodes 85 and 86 will be precharged to (Vdd-2Vt) at this time, and these nodes are equalized by the transistor 107. The voltage on the nodes 95 and 96 are represented by a line 115 and the voltage on the node 85 and 86 represented by a line 116 in FIG. 6. At a time 71, when $\overline{\Phi}$ goes low, the nodes 85, 86, 95 and 96 become isolated because all of the precharge and equalize transistors are cut off. The node 100 is isolated from ground because the transistors 101 and 102 are off, so the transistors 105 and 106 will not discharge the nodes 95 and 96 even though their gates are held high by the nodes 85 and 86.

Figure 6:
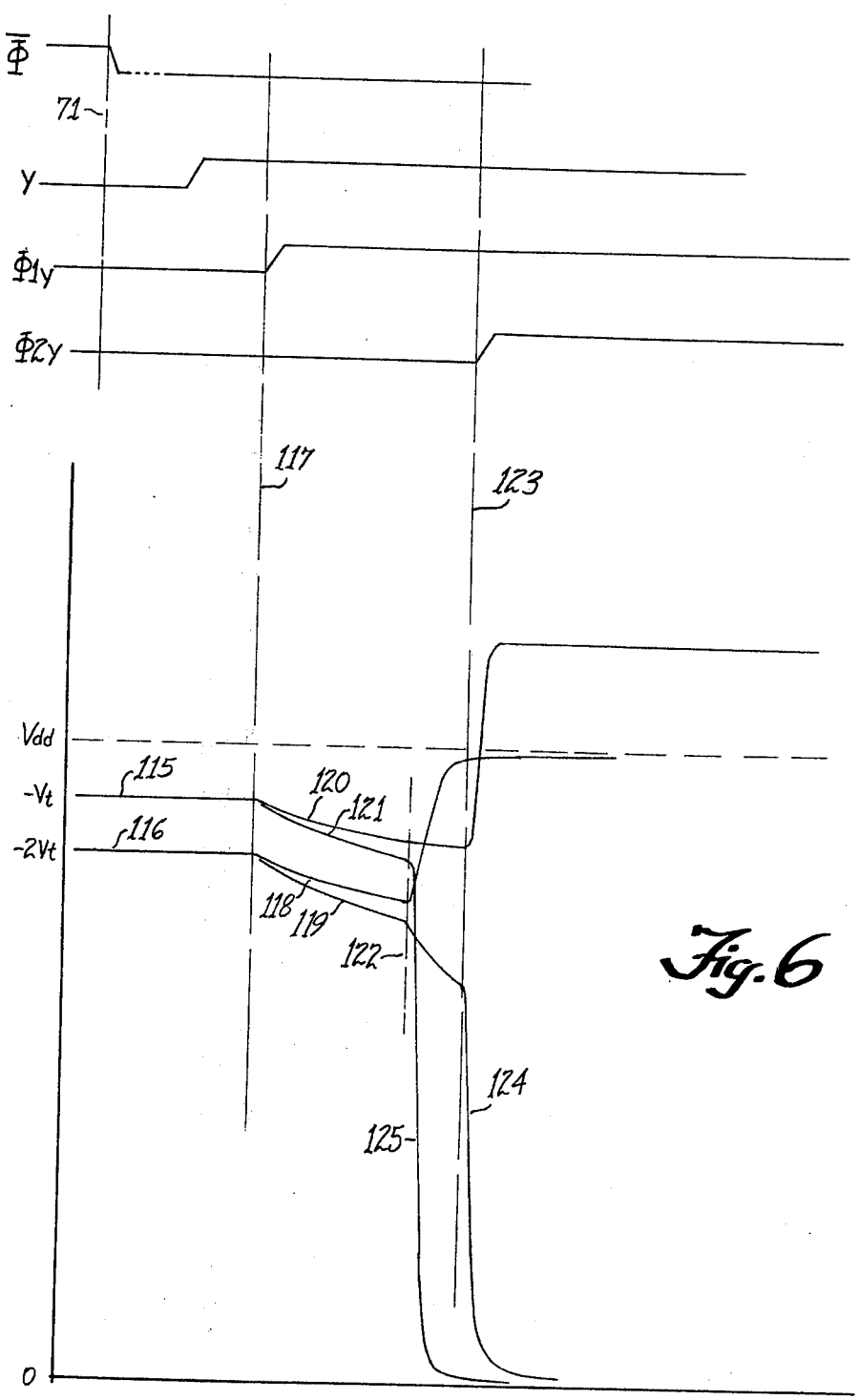
FIG. 6 is a detailed graphic representation of voltage vs. time for certain nodes in the intermediate output buffer circuit 19 of FIG. 3.

When Φ1Y starts high at a time 117, the node 100 begins to be grounded through small transistor 101, and the transistors 93 and 94 are turned on so column data applied to the input transistors 87 and 88 will be effective. For the addressed column line, the transistors 89 and 90 will have been turned on by the Y signal from the column decode 13 so the voltages 56 and 57 on the lines 37 and 38 are applied to the gates of the transistors 87 and 88. This may occur before the time 77 of FIG. 5. One of the voltages 56 or 57 will be higher than the other so one of the nodes 85 and 86 will tend to discharge faster through transistors 87 and 93 or 88 and 94. In FIG. 6, the voltages on the nodes 85 and 86 are represented by lines 118 and 119, and the voltages on the nodes 95 and 96 are represented by lines 120 and 121. At a time 122, the voltages on the nodes 95, 96, 85, 86 100 will be such that one of the transistors 105 or 106 will turn on discharging node 95 or 96 on the zero-going side. Beginning at time 122 and prior to a time 123 when Φ2Y goes high, the lines 120 and 121 as well as the line 118 and 119 will separate much more rapidly as the node 85 or 86 on the "1" side charges from Vdd through transistor 83 or 84 and the node on the "0" side discharges through the driver transistor 81 or 82.

At time 123, Φ2Y goes high and the large transistor 102 begins to conduct so the transistor 81 or 82 on the "0" side will discharge rapidly toward Vss as seen by a line 124. Also, for the "0" side, the transistor 105 or 106 will discharge rapidly toward Vss as seen by a line 125; the gate of the transistor 105 or 106 on the "0" side will be held high by the cross-couple to the opposite node 85 or 86, while the gate of the transistor 105 or 106 on the "1" side will be within one Vt of the node 100 voltage as it is coupled to the node 85 or 86 and transistor 81 or 82 for the "0" side is by this point highly conductive. The Φ2Y clock also functions to boot the level of the "1" node 95 or 96 by the coupling through capacitors 103 and 104. A charge is also coupled to the "0" side but it is dissipated to ground via transistor 105 or 106, now highly conductive via transistor 102.

Output from the circuit 19 is taken from the nodes 95 and 96 in the FIG. 3 embodiment. Lines 110 and 111 connect these nodes to driver transistors 106, clocked on Φ2Y, and grounding transistors 109, to produce data and $\overline{data}$ outputs on lines 112 and 113. The output pin 21 may be driven by a pair of transistors 114 and 115A to provide a tri-state output.

Input to the array from the pin 20 is by a pair of transistors 116A which are turned on by a write signal derived from the R/W command on the pin 22.

Figure 7:
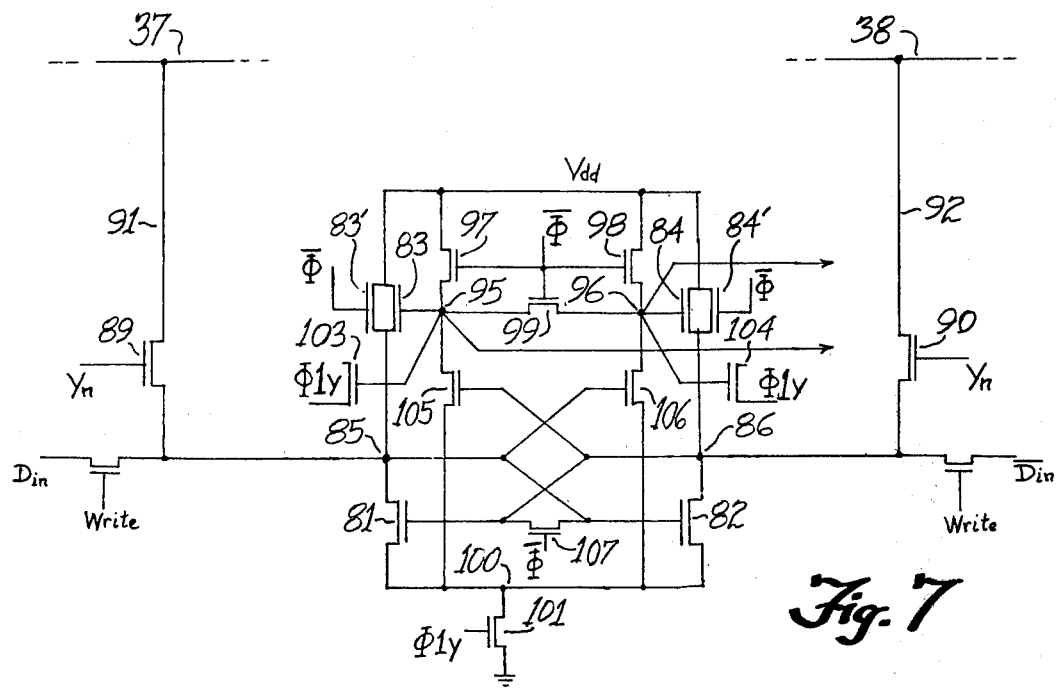
FIG. 7 is an electrical schematic diagram of an intermediate output buffer of the invention according to another embodiment.
Figure 8:
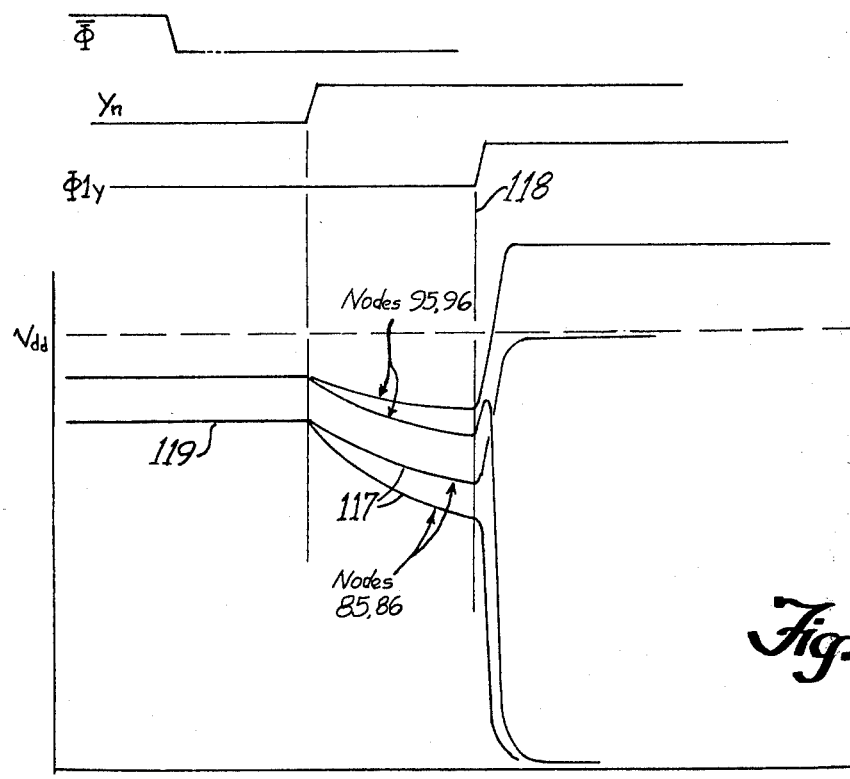
FIG. 8 is a detailed graphic representation of voltage vs. time for certain nodes in the circuit of FIG. 7.

In FIG. 7, another embodiment of the invention is illustrated. In this case, the nodes 85 and 86 are directly connected to the column line halves 37 and 38 of FIG. 3 by lines 91 and 92 and transistors 89 and 90, rather than by the input transistors 87 and 88. Thus, one of the nodes 85 or 86 begins discharging into the zero-going side of the column line as soon as Yn comes on, as seen by line 117 in FIG. 8. Also, the FIG. 7 circuit does not use grounding transistor 102; instead, the transistor 101, turned on by Φ1Y at time 118, is large enough to provide a full logic level output. The gated capacitors 103 and 104 apply Φ1Y to the nodes 95 and 96 at the time 118, so no clock corresponding to the Φ2Y voltage is needed. Another modification of the circuit is the provision of transistors 83' and 84' which shunt the load transistors 83 and 84 during $\overline{\Phi}$ to precharge the nodes 85 and 86. This causes nodes 85 and 86 to precharge to a level 119 which is (Vdd-Vt), the same as the level to which the nodes 95 and 96 are precharged.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A memory system of the type having an aray of rows and columns of memory cells and a sense amplifier positioned at the center of each column line, an intermediate output stage comprising a pair of cross-coupled driver transistors and a precharge/load transistor for each driver transistor, each precharge/load transistor and each driver transistor having a control electrode and having a current path, a pair of sense nodes having capacitance coupled to the column lines one on each side of each sense amplifier, the current paths of the driver transistors separately connecting the sense nodes to one side of a reference potential, the control electrode of each driver transistor being cross-coupled to the sense node for the other driver transistor, means including the current paths of the precharge/load transistors for separately precharging the capacitance of the sense nodes prior to a selected time in an operating cycle, a switching device having a current path connecting the control electrode of each precharge/load transistor to the other side of the reference potential, each switching device having a control electrode, each of the switching devices having its control electrode connected to the opposing sense node, and coupling means for applying a voltage to the control electrodes of the precharge/load transistors at a time subsequent to said selected time.

2. Apparatus according to claim 1 wherein the driver transistors, precharge/load transistors and the switching devices are all MOS transistors each having a channel as a source-drain current path and a gate as its control electrode.

3. Apparatus according to claim 2 wherein the intermediate output stage includes first and second means for connecting one side of the current path of each of the driver transistors and of each of the switching devices to reference potential, and such first and second means are sequentially actuated during said operating cycle.

4. Apparatus according to claim 3 wherein said first and second means includes first and second MOS transistors which are selectively actuated at differing times, one at about said selected time and the other at said time subsequent to the selected time.

5. Apparatus according to claim 4 wherein the ratio of width to length of the channel of the first MOS transistor is very small compared to that of the channels of the driver transistors.

6. Apparatus according to claim 5 wherein said second MOS transistor has a channel width to length ratio greater than that of the first MOS transistor.

7. Apparatus according to claim 1 wherein the coupling means comprises gated capacitors having one side connected to a clock source exhibiting a change in voltage level at said time subsequent to said selected time during each operating cycle.

8. A data output stage for a semiconductor memory array comprising a pair of cross-coupled driver transistors, a pair of load transistors, each driver transistor and each load transistor having a first and a second current carrying electrode and a control electrode, the pair of load transistors separately connecting the second current carrying electrode of each of the driver transistors to one side of a supply voltage via the first and second current carrying electrodes of each load transistor, each of the driver transistors having its second current carrying electrode coupled to one side of a plurality of pairs of opposing digit lines in the memory array which have a plurality of memory cells connected thereto, a pair of switching means each having a current path separately connecting the control electrodes of the load transistors to the other side of the voltage supply whereby the load transistor for the driver transistor which goes to logic zero is rendered non-conductive at a selected time in an operating cycle, and coupling means for controlling each of said switching means by the voltage on the second current carry electrode of the driver transistor on the opposite side of the output stage.

9. An output stage according to claim 8 wherein the driver transistors, the load transistors, and the switching means are all MOS transistors, the first and second current carrying electrodes being sources and drains, the control electrodes being gates, and wherein the means for connecting each of the control electrodes of the load transistors to said other side of the voltage supply comprises a pair of MOS transistors which have each of their gates separately connected to the drain of the driver transistor on the opposite side of the output stage.

10. An output stage according to claim 8 wherein two separate control transistors connect the first current carrying electrodes of the driver transistors to said other side of the voltage supply, control voltage generator means is provided to actuate one of the control transistors at a first time in an operating cycle and activating the other of the control transistors at a selected time later than the first time in each operating cycle.

11. An output stage according to claim 10 wherein said one of the control transistors conducts much less current than the other of the control transistors.

12. An output stage according to claim 9 wherein capacitor means separately couples a clock voltage source to the control electrodes of the load transistors, said source producing a clock voltage at about the said second time in each operating cycle.

13. An output stage according to claim 12 wherein means are provided for precharging the capacitance of the drains of the driver transistors and the capacitance of the drains of the driver transistors and the capacitance of the gate of the load transistors at a time prior to said first time in such operating cycle.

* * * * *